United States Patent
Xin et al.

(10) Patent No.: US 10,516,081 B1
(45) Date of Patent: Dec. 24, 2019

(54) HIGH EFFICIENCY HEXAGON LED FOR MICRO LED APPLICATION

(71) Applicant: Apple Inc., Cupertino, CA (US)

(72) Inventors: Xiaobin Xin, Santa Clara, CA (US); Dmitry S. Sizov, Cupertino, CA (US); Andreas Bibl, Los Altos, CA (US); Ion Bita, Santa Clara, CA (US); Yuan Chen, San Jose, CA (US); Lai Wang, Fremont, CA (US); Zhibing Ge, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/908,492

(22) Filed: Feb. 28, 2018

Related U.S. Application Data

(60) Provisional application No. 62/487,782, filed on Apr. 20, 2017.

(51) Int. Cl.
*H01L 33/24* (2010.01)
*H01L 33/60* (2010.01)
*H01L 33/42* (2010.01)
*H01L 33/18* (2010.01)
*H01L 27/15* (2006.01)
*H01L 33/52* (2010.01)

(52) U.S. Cl.
CPC .......... *H01L 33/24* (2013.01); *H01L 27/156* (2013.01); *H01L 33/18* (2013.01); *H01L 33/42* (2013.01); *H01L 33/52* (2013.01); *H01L 33/60* (2013.01)

(58) Field of Classification Search
CPC ....... H01L 33/16; H01L 33/18; H01L 25/167; H01L 33/20; H01L 33/24; H01L 33/60
See application file for complete search history.

(56) References Cited

U.S. PATENT DOCUMENTS

| | | | |
|---|---|---|---|
| 9,287,475 B2 | 3/2016 | Andrews et al. | |
| 2009/0045423 A1 | 2/2009 | Hashimoto et al. | |
| 2011/0062469 A1* | 3/2011 | Camras et al. | H01L 33/58 257/98 |
| 2014/0159064 A1* | 6/2014 | Sakariya | H01L 25/0753 257/88 |
| 2015/0187991 A1* | 7/2015 | McGroddy | H01L 27/016 257/13 |
| 2016/0141472 A1 | 5/2016 | Son et al. | |
| 2016/0240518 A1* | 8/2016 | Hayashi | H01L 25/0753 |
| 2017/0294565 A1* | 10/2017 | Kim | H01L 25/0753 |
| 2018/0145233 A1* | 5/2018 | Tokunaga | H01L 33/58 |

* cited by examiner

*Primary Examiner* — Frederick B Hargrove
(74) *Attorney, Agent, or Firm* — Jaffery Watson Mendonsa & Hamilton LLP

(57) ABSTRACT

Light emitting structures are described in which vertical inorganic semiconductor-based light emitting diodes (LEDs) with hexagon shaped sidewalls are mounted within corresponding circular reflective well structures. Diffuser layers may additionally laterally surround the hexagon shaped sidewalls within the circular reflective well structures.

17 Claims, 8 Drawing Sheets

US 10,516,081 B1

HIGH EFFICIENCY HEXAGON LED FOR MICRO LED APPLICATION

RELATED APPLICATIONS

This application claims the benefit of priority of U.S. Provisional Application No. 62/487,782 filed Apr. 20, 2017 which is incorporated herein by reference.

BACKGROUND

Field

Embodiments described herein relate to light emitting devices. More particularly, embodiments relate to structures to facilitate light extraction.

Background Information

State of the art displays for phones, tablets, computers, and televisions utilize glass substrates with thin film transistor (TFTs) to control transmission of backlight though pixels based on liquid crystals. More recently emissive displays such as those based on organic light emitting diodes (OLEDs) have been introduced as being more power efficient, and allowing each pixel to be turned off completely when displaying black. Even more recently, it has been proposed to incorporate emissive inorganic semiconductor-based micro LEDs into high resolution displays. Compared to OLEDs, inorganic semiconductor-based LEDs may be more energy efficient and also may not be prone to lifetime degradation and extreme sensitivity to moisture.

Many factors contribute to the luminous efficacy of an LED device, such as internal quantum efficiency (IQE), or the ability to internally generate photons, and external quantum efficiency (EQE), which is a function of IQE and light extraction efficiency (LEE) from the LED device.

SUMMARY

Embodiments describe light emitting structures, and LED donor substrates and LEDs for integration into light emitting structures. In an embodiment, a light emitting structure includes a first circular reflective well structure, a first vertical inorganic semiconductor-based light emitting diode (LED) including first hexagon shaped sidewalls mounted within the first reflective well structure, and a diffuser layer within the first circular reflective well structure. The diffuser layer laterally surrounds the first hexagon shaped sidewalls, and the diffuser layer may include scattering particles dispersed in a matrix material.

In accordance with embodiments, well angle of the circular reflective well structure may affect LEE. In an embodiment, the circular sidewall has a well angle of 30 to 60 degrees to horizontal. A well angle (the largest tolerable angle for smaller well size thus the highest pixel density) may be chosen based on processing controllability, facet angle of the well structure, and light emission angular profiles to achieve the maximized efficiency. The reflectance of the well surface may be higher than 50% in accordance with embodiments. Practically it is possible to implement materials (such as aluminum alloy or silver alloy) to achieve high reflectance 85%-98% for all colors (blue, green and red). In accordance with embodiments, presence of the diffuser layer may affect LEE and angular distribution of emitted light. In particular, the diffuser layer may help create an angular profile closer to Lambertian for all LED colors. Additionally, concentration of the scattering particles with the diffuser layer may affect LEE. In an embodiment, the diffuser layer includes 1-7% by volume of the scattering particles. The diffuser layer may include scattering particles with an average particle size between 70-500 nm. Additionally, the scattering particles may have a different refractive index, n, (such as 2.1-2.4, or as low as 1.0-1.3), where the index contrast is greater than 0.3 (absolute value) from the host material (matrix) with an index of refraction of 1.4-1.8.

A transparent conductor layer may span over the diffuser layer and within the circular reflective well structure, and also be formed on an in electrical contact with a top contact of the first vertical inorganic semiconductor-based LED. The first circular reflective well structure may be taller than the first vertical inorganic semiconductor-based LED, such that a top surface of the first vertical inorganic semiconductor-based LED is below a top surface of the first circular reflective well structure.

The first vertical inorganic semiconductor-based LED may be formed of a variety of compound materials, for a variety of different primary color emissions. Additionally, a plurality of the light emitting structure may include a variety of vertical inorganic semiconductor-based LEDs formed of different materials, for different primary color emissions. In an embodiment, the first vertical inorganic semiconductor-based LED has a hexagonal crystal structure, and the first hexagonal shaped sidewalls are faceted sidewalls. In an embodiment, the first vertical inorganic semiconductor-based LED has a cubic crystal structure, and the first hexagonal shaped sidewalls are not faceted sidewalls. In such an embodiment, the first vertical inorganic semiconductor-based LED may include a current confinement region (e.g. doped region) along the first hexagonal shaped sidewalls to confine current internally within the first vertical inorganic semiconductor-based LED.

In an embodiment, the light emitting structure includes multiple LEDs mounted within multiple circular reflective well structures. For example, the light emitting structure may additionally include a second circular reflective well structure, a second vertical inorganic semiconductor-based LED including second hexagon shaped sidewalls mounted within the second reflective well structure, where the diffuser layer is additionally located within the second circular reflective well structure. Thus, the same diffuser layer may be located within both the first and second circular reflective well structures. In an embodiment, the diffuser layer includes 2-7% by volume of the scattering particles. Likewise, the transparent conductor layer may span over the diffuser layer within the first circular reflective well structure and on and in electrical contact with a top contact of the first vertical inorganic semiconductor-based LED, and the second circular reflective well structure and on and in electrical contact with a top contact of the second vertical inorganic semiconductor-based LED.

In accordance with embodiments, the light emitting structure may include LEDs designed for different primary color emission wavelengths. For example, the first vertical inorganic semiconductor-based LED may have a hexagonal crystal structure with faceted sidewalls, while the second vertical inorganic semiconductor-based LED has a cubic crystal structure, in which the sidewalls are not faceted. The first and second circular reflective well structures may have the same sidewall angles or different well angles. In an embodiment, both the first and second circular reflective well structures have well angles of 30 to 60 degrees to horizontal. In an embodiment, each of the first and second circular reflective well structures has a bottom diameter of 16 μm or larger and a top diameter of 25 μm or less.

In an embodiment the structure for an LED donor substrate includes a stabilization layer which includes an array of stabilization posts, and an array of vertical inorganic semiconductor-based LEDs on the array of stabilization posts. In an embodiment, each vertical inorganic semiconductor-based LED includes bottom surface that is wider than a corresponding stabilization post directly underneath the bottom surface, and each vertical inorganic semiconductor-based LED includes hexagon shaped sidewalls. The structure may include an array of bottom conductive contacts on bottom surfaces of the array of vertical inorganic semiconductor-based LEDs. Each vertical inorganic semiconductor-based LED may be supported by a single, or plurality of stabilization posts. In an embodiment, a plurality of stabilization posts are bonded to a single bottom conductive contact.

DETAILED DESCRIPTION

Figure 1A:
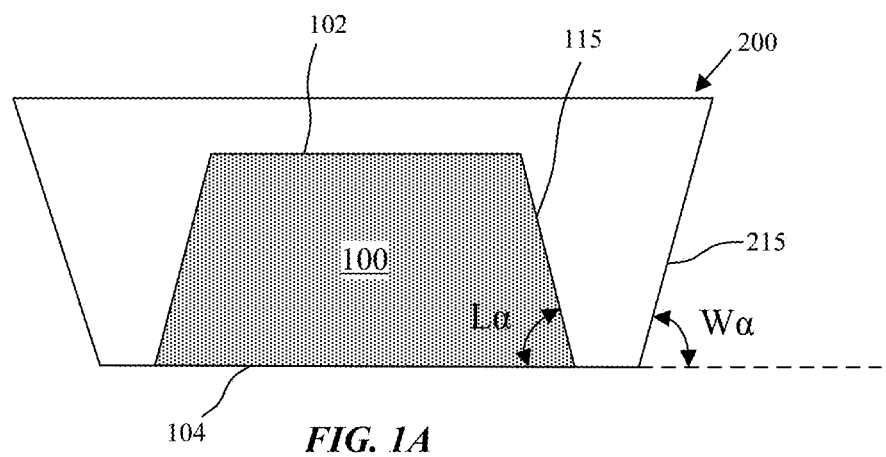
FIG. 1A is a schematic cross-sectional side view illustration of a hexagon shaped LED mounted within a reflective well structure in accordance with an embodiment.

Embodiments describe light emitting devices and structures to facilitate light extraction. Specifically, embodiments describe LED shape designs and reflective well structures. In accordance with embodiments, light emitting structures are described in which LEDs with hexagon shaped sidewalls are mounted within circular reflective well structures. Furthermore, the hexagon shaped sidewalls may be applied to the LED designs for all major colors (e.g. red, blue, green) within a light emitting device, such as a display.

It has been observed that LEE from LEDs is a function of LED dimensions, and dimensions of the surrounding reflective well structures. In one aspect, it has been observed that a hexagon shaped LED results in a better fit within a circular well structure when compared to a traditional square shaped LED. While circular well structures are shown to provide higher LEE for both square LEDs and hexagon LEDs, it has been shown that square LEDs may require larger circular well structure diameters, which can affect LEE, process margin, and pixel resolution. In accordance with embodiments, hexagon LEDs are shown to provide higher LEE compared to both square shaped and circular shaped LEDs. Additionally, the geometrical fit of hexagon shaped LEDs may enable more compact pixel staggering and resolution.

In one aspect, it has been observed that hexagon shaped LEDs can compensate IQE loss. For example, the sidewalls for emissive LEDs may represent non-radiative recombination sinks for injected carriers. The characteristic distance over which the sidewall surface effect occurs is related to the carrier diffusion length, which may typically approach or be within the maximum LED width for micro LEDs in accordance with embodiments. Thus, the IQE degradation observed with micro LEDs may be particularly severe compared to bulk LED applications. In accordance with embodiments, a hexagon shaped LED may reduce the perimeter to area ratio compared to other LED shapes such as square. For example, for the same area of interest, a hexagon shaped LED has 7% less perimeter than a square shaped LED. The shorter perimeter may result in higher IQE, where peripheral boundaries are a major source of parasitic non-radiative recombination or trap density. Additionally, aligning LED sidewalls with certain facets with less dangling bonds may have specific IQE benefits in reducing sidewall impact. Accordingly, it is expected that the hexagon shaped LEDs within reflective well structures in accordance with embodiments may contribute to increased IQE, LEE and ultimately EQE.

In another aspect, it has been observed that the addition of a diffuser layer within the circular reflective well structure, and laterally surrounding the hexagon shaped sidewalls, may facilitate the result of a Lambertian emission profile, and potentially increase LEE for certain LEDs. A diffuser layer may additionally have the effect of improving tolerance of processing errors.

In another aspect, it has been observed that hexagon shaped LEDs can facilitate cost benefits. For example, considering the LED lateral size of interest, a hexagon shaped LED has 13.4% less area compared to a square shaped LED. This enables the arrangement of more LEDs on a donor substrate, and correspondingly more efficient use of epitaxial material and processing of bulk LED substrates.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", and "on" as used herein may refer to a relative position of one layer with respect to other layers. One layer directly "over" a layer is located directionally over, as opposed to above yet not over (e.g. diagonal). One layer "over", "directly over", or "on" another layer or bonded "to" or in "contact" with another layer may be directly in contact with the other layer or may have one or more intervening layers. One layer between layers may be directly in contact with the layers or may have one or more intervening layers.

Figure 1B:
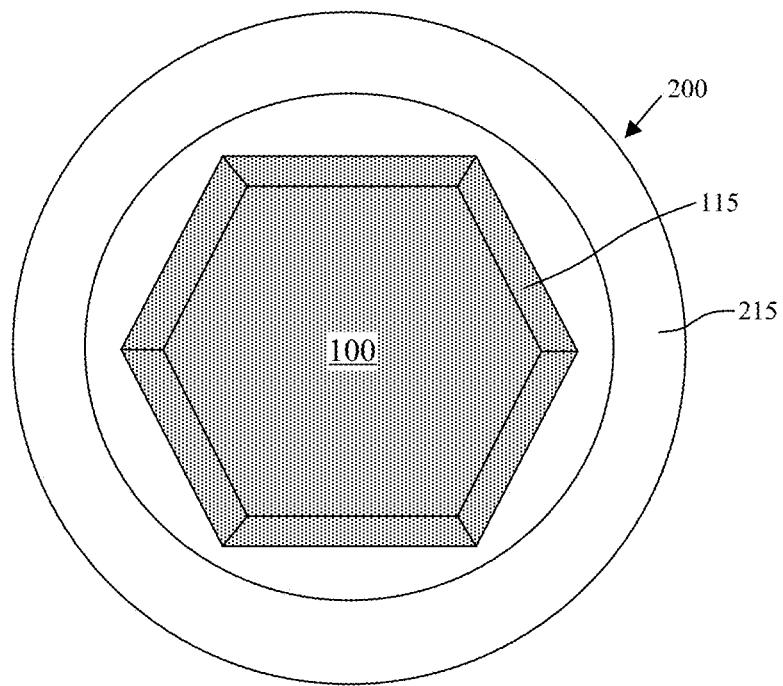
FIG. 1B is a schematic top view illustration of a hexagon shaped LED mounted within a reflective well structure in accordance with an embodiment.

FIGS. 1A-1B is a schematic cross-sectional side view and top view illustrations of a hexagon shaped LED mounted within a reflective well structure in accordance with an embodiment. The LEDs 100 in accordance with embodiments may possess a variety of shapes, and characteristics. Accordingly, the simplified LED 100 structure in FIGS. 1A-1B is meant to be exemplary and not limiting. Generally, each LED 100 may include a top side 102, a bottom side 104, and sidewalls 115 that may extend from the top side 102 to the bottom side 104. The sidewalls 115 may be continuous, straight, or have a complex contour. In an embodiment, the sidewalls may be characterized by a sidewall angle (Lα) to internal. As illustrated, the sidewalls 115 are outwardly tapered from the top side 102 to bottom side 104, though the sidewalls may alternatively be inwardly tapered or vertical.

As shown, the LED 100 is mounted within a reflective well structure 200. In accordance with embodiments, the reflective well structure 200 is circular, including circular sidewall 215. The circular sidewall 215 may be defined by a well angle (Wα) to horizontal. In accordance with embodiments, the well angle (Wα) may be adjusted for LEE. In some embodiments, the angle (Wα) is 30 to 60 degrees to horizontal, such as 30 to 45 degrees. The well angle (Wα) may be the same for LEDs of different emission wavelengths (color), or different for LEDs of different emission wavelengths. In accordance with embodiments, the height of the reflective well structures 200 may be greater than the height of the LEDs 100, for example, by 1-7 μm. In an embodiment, height (depth) of the reflective well structures 200 is 2-10 μm. In an embodiment, the reflective well structure has a bottom diameter of 16 μm or larger and a top diameter of 25 μm or less.

In accordance with embodiments, the LEDs 100 may be formed of inorganic semiconductor-based materials. In accordance with embodiments, the LEDs 100 may be micro LEDs with maximum lateral dimensions between sidewalls of 1 to 300 μm, 1 to 100 μm, 1 to 20 μm, or more specifically 1 to 10 μm, such as 5 μm. In the following description the exemplary LEDs may be designed for emission of a variety of primary wavelengths, such as a primary red light (e.g. 620-750 nm wavelength), primary green light (e.g. 495-570 nm wavelength), or primary blue light (e.g. 450-495 nm wavelength), though embodiments are not limited to these exemplary emission spectra. The LEDs may be formed of a variety of compound inorganic semiconductors having a bandgap corresponding to a specific region in the spectrum. For example, the LEDs can include one or more layers based on II-VI materials (e.g. ZnSe) or III-V materials including III-V nitride materials (e.g. GaN, AlN, InN, InGaN, and their alloys), III-V phosphide materials (e.g. GaP, InGaP, AlGaInP, and their alloys), and III-V arsenide alloys (AlGaAs).

In an embodiment, the LEDs 100 may be phosphorous-based inorganic semiconductor-based LEDs (e.g. GaP, InGaP, AlGaInP, and their alloys) including hexagon shaped sidewalls 115. For example, the phosphorous-based LEDs 100 may be designed for emission of a primarily red wavelength of light. In such an embodiment, the LEDs 100 may have a cubic crystal structure. As a result, the formation of hexagon shaped LEDs 100 does not result in uniformly faceted sidewalls 115. In an embodiment, the LEDs 100 may be nitride-based inorganic semiconductor-based LEDs (e.g. GaN, AlN, InN, InGaN, and their alloys) including hexagon shaped sidewalls 115. For example, the nitride-based LEDs 100 may be designed for emission of a primarily blue or green wavelength of light. In such an embodiment, the LEDs 100 may have a hexagonal crystal structure. As a result, the formation of hexagon shaped LEDs 100 may result in faceted sidewalls 115. For example, each of the sidewalls 115 can be formed along an a-plane or m-plane within the hexagonal crystal structure.

Figure 2:
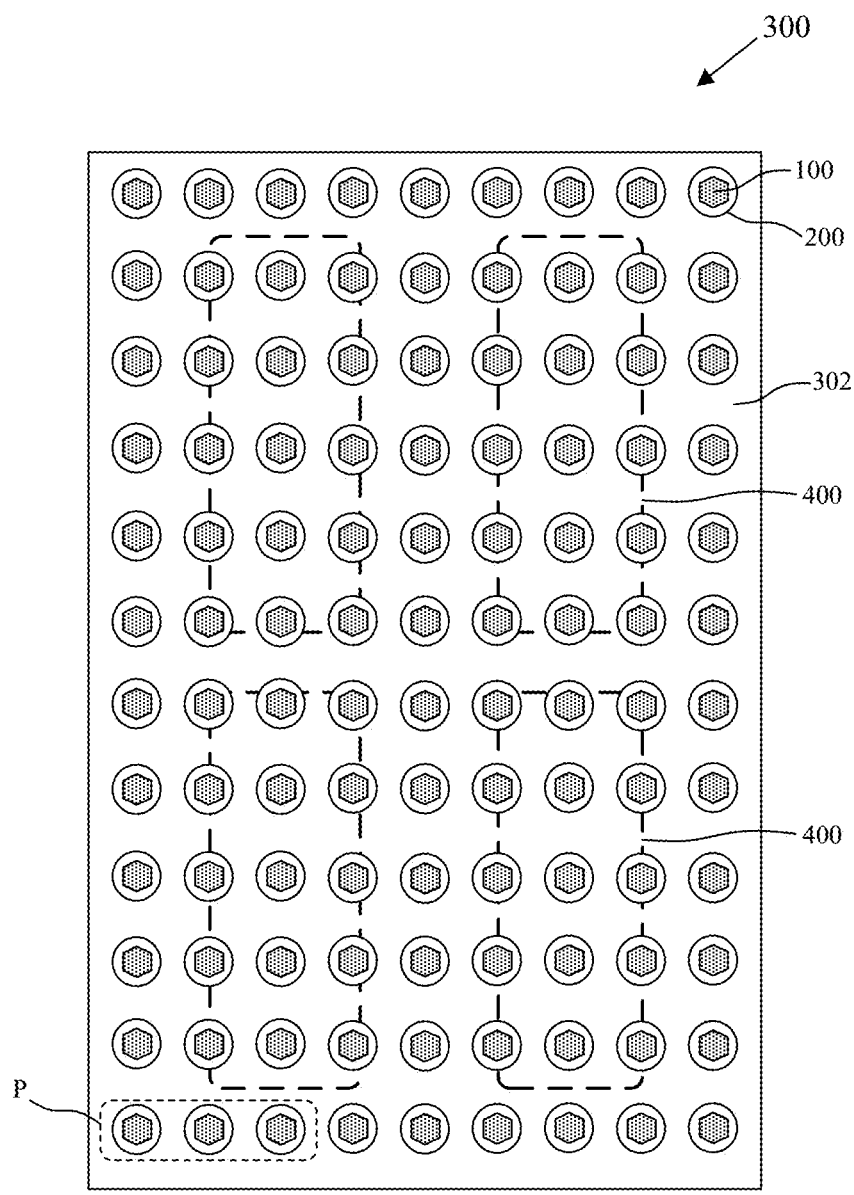
FIG. 2 is a schematic top view illustration of a light emitting device including an array of hexagon shaped LEDs mounted within an array of reflective well structures in accordance with an embodiment.
Figure 3:
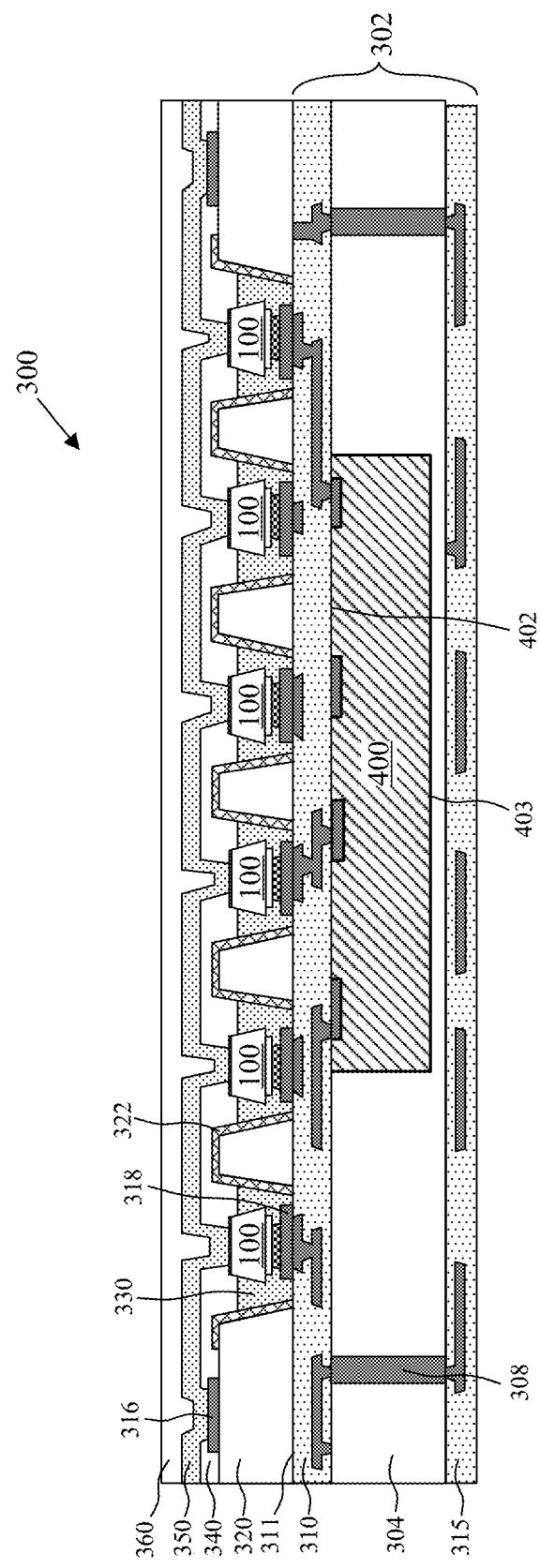
FIG. 3 is a close-up schematic cross-sectional side view illustration of a light emitting device including an array of hexagon shaped LEDs mounted within an array of reflective well structures and electrically coupled to an embedded micro driver chip in accordance with an embodiment.

Referring now to FIGS. 2-3, schematic top view and close-up schematic cross-sectional side view illustrations are provided of a light emitting device 300 including an array of hexagon shaped LEDs 100 mounted within an array of circular reflective well structures in accordance with an embodiment. In an embodiment, the light emitting device 300 may be a display, including an array of pixels P, including multiple LEDs 100 with different primary emission wavelengths (colors). Each pixel may include multiple subpixels that emit different colors of lights. In a red-green-blue (RGB) subpixel arrangement, each pixel may include three subpixels that emit red light, green light, and blue light, respectively. It is to be appreciated that the RGB arrangement is exemplary and that this disclosure is not so limited. Examples of other subpixel arrangements that can be utilized include, but are not limited to, red-green-blue-yellow (RGBY), red-green-blue-yellow-cyan (RGBYC), or red-green-blue-white (RGBW), or other subpixel matrix schemes where the pixels may have different number of subpixels.

In accordance with some embodiments, a plurality of pixel driver chips 400 are embedded within a substrate 302 allowing scalability of the light emitting device (e.g. display panel) to high resolutions with high pixels per inch (PPI). In accordance with embodiments, the pixel driver chips 400 may be located directly beneath the LEDs 100 and directly beneath the display area of the display panel. In an embodiment, the pixel driver chips each have a minimum x-y dimension that that is larger than a maximum pitch in the x-y dimensions between adjacent LEDs 100. In an embodiment, an array of pixel driver chips 400 is embedded front side 402 up in an insulator layer 304. A front side redistribution layer (RDL) 310 spans across and is in electrical connection with the front sides 402 of the array of pixel driver chips 400. An array of LEDs 100 is bonded to the front side RDL 410, the array of LEDs 100 is arranged in an array of pixels P.

In an embodiment a pixel driver may be in the form of a chip. In accordance with embodiments, the pixel driver chips 400 can replace the circuitry for each display element as commonly employed in a thin film transistor (TFT) architecture. Furthermore, the circuitry for a plurality of LEDs, and pixels, may be located within a single pixel driver chip 400. In accordance with embodiments, each pixel driver chip 400 may switch and drive a plurality of LEDs 100 in the array of LEDs for a plurality of pixels.

The light emitting structures 300 in accordance with embodiments may include digital components, analog components, or a combination of both. For example, each pixel driver chip 400 may include an analog driving circuit, a digital driving circuit, or a driving circuit combining both analog and digital components. Additionally, MOSFET processing techniques may be used for fabrication of the pixel driver chips 400 on single crystalline silicon as opposed to TFT processing techniques on amorphous silicon (a-Si) or low temperature polysilicon (LTPS).

Referring to FIG. 3, each of the LEDs 100 may be bonded to a respective contact pad 318 on a front side 311 of the front side RDL 310. A bank layer 320 is formed over the front side RDL 310, and patterned to form an array of bank openings. In an embodiment, the bank layer 310 and openings form the reflective well structures 200. In an embodiment, a mirror layer 322 is formed along the sidewalls of the bank openings, and optionally on the front side RDL 310 and optionally over the top side of the bank layer 310. Suitable materials to form the mirror layers 322 and/or reflective well structure 200 or substrate may include those reflective to the emissive wavelength spectrum of the LEDs 100, including but not limited to aluminum, gold, silver. The mirror layer 322 may function as the sidewalls 215 of the reflective well structures 200. The reflectance of the mirror layers 322 forming well surface may be higher than 50% in accordance with embodiments. Practically it is possible to implement materials (such as aluminum alloy or silver alloy) to achieve high reflectance 85%-98% for all colors (blue, green and red).

In an embodiment, a diffuser layer 330 including scattering particles dispersed within a matrix material is formed laterally around the LEDs 100 within the circular reflective well structures 200. In an embodiment, the matrix material has a refractive index of 1.4 to 1.8. A diffuser layer 130 may be deposited using a suitable technique such as spin casting, slot die coating, or other polymer film deposition technique. In accordance with embodiments, the diffuser layer 130 may be applied individually within each corresponding well structure opening, across multiple well structure openings, or as a global layer across the display area. In an embodiment, diffuser layer 330 is formed of a thermoset material for example, an acrylic such as poly(methyl methacrylate) (PMMA), benzocyclobutene (BCB), epoxy, etc. An exemplary PMMA material may have a refractive index of approximately 1.5. Diffuser layer 330 may also be formed of a higher index material. A variety of scattering particles may be used, including metal oxides, and non-conductive materials. For example, an exemplary scattering particle may be $TiO_2$. In an embodiment, average particle size is chosen to have a maximized scattering effect for a given wavelength range. For example, the average particle size may be between 70 nm and 500 nm, or more specifically between 100 nm and 400 nm. In an embodiment, the diffuser layer is a high index layer, for example, and may be filled with high refractive index nanoparticles, such as with Zr-oxide nanoparticles, in addition to scattering particles.

In an embodiment, a passivation layer 340 may optionally be formed over the diffuser layer 330. The passivation layer 340 may potentially serve any of a variety of functions. For example, the passivation layer 340 can be a low index material that functions as an angular filter. For example, the passivation layer 340 may provide electrical insulation over the mirror layers 322. If necessary, openings may optionally be formed in the diffuser layer 330 and/or passivation layer 340 in order to expose the top conductive contacts of the LEDs 100. In accordance with some embodiments, the diffuser layer 330 and the passivation layer 340 may be formed of the same material. For example, they may both be formed of the same polymer, and include the same scattering particles. Thus, the passivation layer 340 may optionally function as a diffuser layer.

One or more top conductive contact layers 350 may then be formed over one or more, or all of the LEDs 100. In an embodiment, top conductive contact layer 350 is transparent. For example, top conductive contact layer 350 may be formed of a transparent conductive oxide such as indium-tin oxide (ITO), or a transparent conductive polymer such as poly(3,4-ethylenedioxythiophene) (PEDOT). In an embodiment, top conductive contact layer 350 is additionally formed on and in electrical contact with a terminal contact 316 (e.g. Vss, ground, low voltage contact, etc.). A top overcoat layer 360 may then optionally be formed over the top conductive contact layer 350. Top overcoat layer 360 may include one or more optical films for the light emitting device. The films forming the overcoat layer 360 may be deposited, laminated, or a hard glass film can be sealed on top of the structure. For example, this can take place in a nitrogen, argon, or vacuum environment. In an embodiment, an overcoat layer 360 may include any of a black matrix layer, color filters, polarizers and thin cover glass, etc.

In accordance with embodiments, a back side RDL 315 optionally spans across the insulator layer 304 and back sides 403 of the array of pixel driver chips 400. Additionally, a plurality of conductive pillars 308 may optionally extend through the insulator layer 404 from the back side RDL 315 to the front side RDL 310. While a back side RDL 315 and conductive pillars 308 are not required in accordance with embodiments, such a configuration can be used to increase the available display area on the front side of the substrate by providing routing to the back side of the display panel 100 as opposed to edges of the display panel.

In accordance with embodiments, additional components can be connected with or mounted on the front side RDL 310 or back side RDL 315, such as row driver chips, column driver chips, power management IC, timing controller, touch sense IC, wireless controller, communications IC, processor, memory etc. or optionally a flex circuit.

In the following description, several Simulation Examples are provided to demonstrate the effect of well angle, LED shape, and diffuser layer on LEE and angular distribution. While certain trends and ranges are provided, it is to be appreciated, that variation of alternate parameters may affect the values and trends. Thus, the following Simulation Examples are to be interpreted as specific implementations, to which embodiments are not limited.

Simulation Example 1

In order to test the effect of well angle (Wα) and LED shape on LEE, simulation tests were performed for hexagon shaped, square shaped, and circular shaped LEDs within circular reflective well structures. Specifically, each LED had a maximum width of 10 μm, and was mounted into a circular reflective well structure of 16 μm diameter at the bottom surface. Each LED was laterally surrounded by a passivation material with a refractive index of 1.5.

Figure 4:
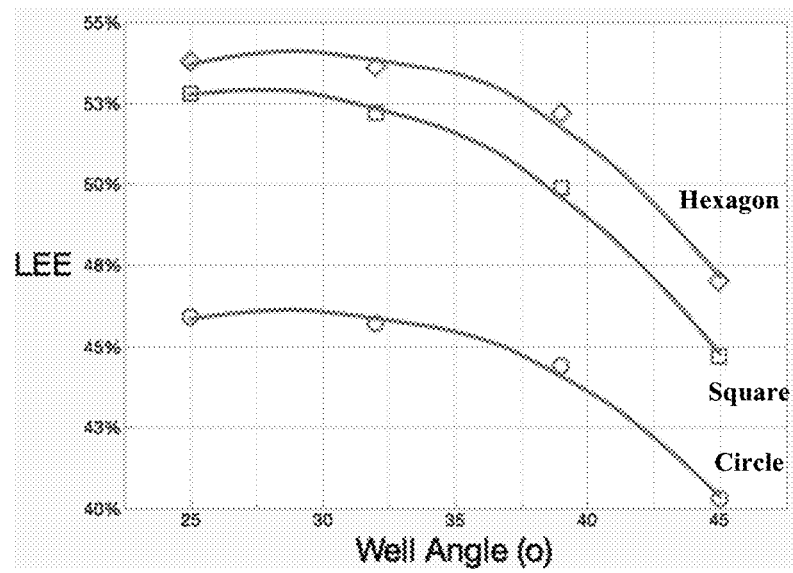
FIG. 4 is a graph illustrating simulation data of LEE for different well angles of nitride-based LEDs in accordance with embodiments.
Figure 5:
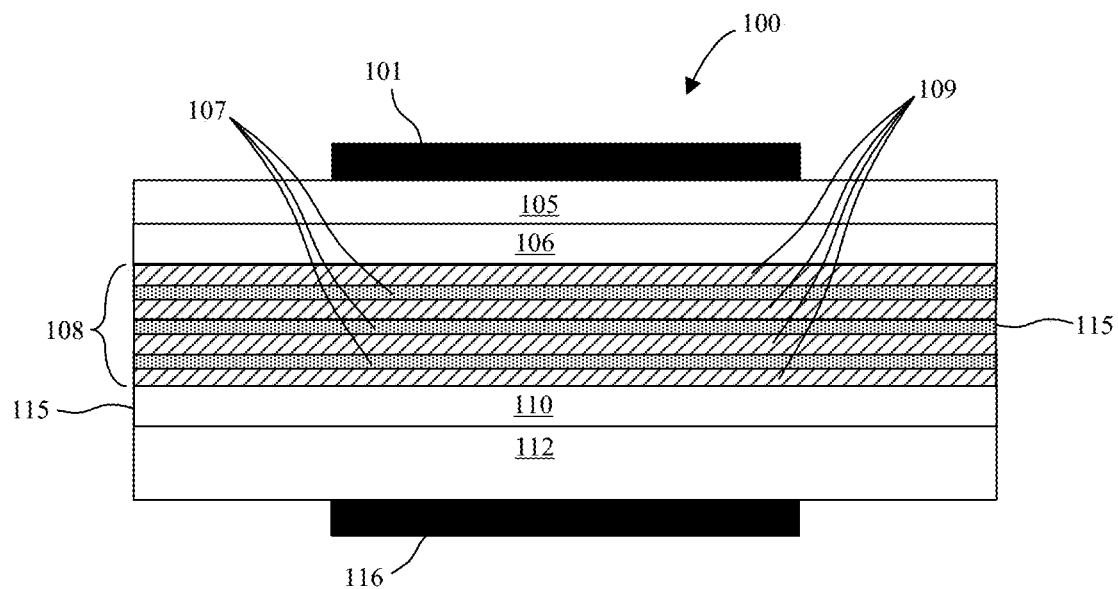
FIG. 5 is a schematic cross-sectional side view illustration of a nitride-based LED in accordance with an embodiment.

FIG. 4 is a graph illustrating simulation data of LEE for nitride-based LEDs designed for a primary blue wavelength emission mounted within circular reflective well structures with different well angles. As shown, hexagon shaped LEDs mounted within circular reflective well structures provide higher LEE when compared to square and circular shaped LEDs. More specifically, LEE greater than 50% is achieved. In accordance with embodiments, LEE can be shown to be relatively stable for hexagon shaped LEDs mounted within circular reflective well structures with well angles (Wα) approximately 30-60 degrees to horizontal, or even less than approximately less than 40 degrees to horizontal in some implementations. Additionally, LEE for the hexagon shaped LEDs remains higher than for other shaped LEDs at higher well angles (Wα), which may potentially have more suitable process capability, and minimize the footprint on the light emitting structure. While the results of FIG. 4 are provided for nitride-based LEDs designed for a primarily blue wavelength emission, LEDs designed for a primarily green wavelength emission can be similarly formed from nitride-based materials. Accordingly, it is believed that the trends provided in FIG. 4 are similarly applicable to nitride-based LEDs designed for a primarily green wavelength emission FIG. 5 is a schematic cross-sectional side view illustration of a nitride-based LED in accordance with an embodiment. The LEDs 100 can include a variety of configurations depending upon application. Accordingly, the specific structure illustrated in FIG. 5 is intended to be exemplary, and embodiments are not limited to the exemplary structure. Generally, the LEDs 100 include a p-n diode that includes a top region (e.g. layer) 105 doped with a first dopant type (e.g. n-doped), a bottom region (e.g. layer) 112 doped with a second, and opposite, dopant type (e.g. p-doped), and an active region (e.g. layer) 108 between the top region 105 and the bottom region 112. For example, the active region 108 may be a single quantum well (SQW) or multi-quantum well (MQW) layer including alternating quantum well layers 107 and barrier layers 109. Additional layers may optionally be included in LED. For example, cladding layers 106, 110 may be formed on opposite sides of the active region 108 to confine current within the active region 108 and may possess a larger bandgap than the active region 108. Cladding layers may be doped to match the doping of the adjacent top and bottom regions 105, 112, or undoped. In other embodiments, the doping in the top and bottom regions 105, 112 is reversed.

In accordance with embodiments, the LEDs 100 can additionally include a top conductive contact 101 formed on a top side 102 of the p-n diode, and a bottom conductive contact 114 formed on a bottom side 104 of the p-n diode. In an embodiment, the bottom conductive contact 114 is formed of a conductive oxide, such as indium-tin-oxide (ITO) with a thickness of 500-1,000 angstroms, and may facilitate the formation of an ohmic contact with the bottom region 112. In an embodiment, bottom conductive contact 114 may include a metal layer or metal stack. For example, the bottom conductive contact 114 may include a metal stack of Pt/Au/Ni. In accordance with embodiment, the top conductive contact 101 includes a thin metal layer or layer stack. Top conductive contacts 101 may also be a conductive oxide such as indium-tin-oxide (ITO), or a combination of one or more metal layers and a conductive oxide. For example, the top conductive contact 101 may include a Ge/Au stack. Where top conductive contacts 101 include metal, the thickness may be thin for transparency and reflectivity reasons. In an embodiment where the conductive contacts 101 are formed of a transparent material such as ITO, the conductive contacts may be thicker, such as 1,000 to 2,000 angstroms.

As shown, the LED 100 may include sidewalls 115, and optionally a conformal insulating layer formed along the sidewalls 115. For example insulating layer may be formed of an oxide material such as $Al_2O_3$ or $SiO_2$ or nitride material such as $SiN_x$. Sidewalls 115 may be characterized by a sidewall angle ($α_1$) to internal. Sidewall angles in accordance with embodiments, may additionally be selected to increase LEE. In an embodiment, the sidewalls 115 are faceted. For example, each of the sidewalls 115 can be formed along an a-plane or m-plane within a hexagonal crystal structure.

By way of example, in an embodiment, the LED 200 is designed for emission of blue or green light, and the materials are nitride based. The followed listing of materials for blue or green emission is intended to be exemplary and not limiting. For example the layers forming the LED 100 may include GaN, AlGaN, InGaN. In an embodiment, top region (layer) 105 includes n-GaN, cladding layer 106 includes n-InGaN, cladding layer 110 includes p-AlGaN (e.g. Mg dopant), and bottom region (layer) 112 includes p-GaN. Quantum well 108 may be formed of a variety of materials, such as but not limited to, InGaN. In an embodiment, the active region (layer) 108 includes multiple quantum well layers 107 and quantum barrier layers 109. In an embodiment, the quantum barrier layers 109 are formed of undoped GaN, and the quantum well layers 107 are formed of InGaN.

Simulation Example 2

Figure 6:
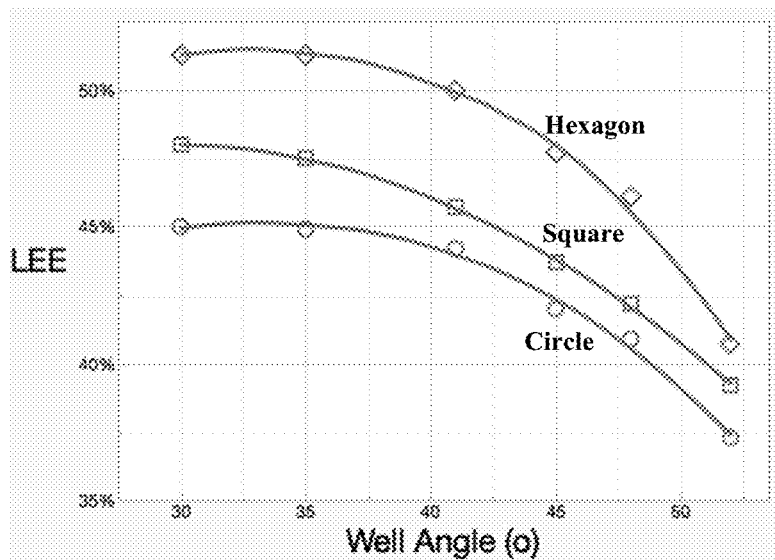
FIG. 6 is a graph illustrating simulation data of LEE for different well angles of phosphorous-based LEDs in accordance with embodiments.

Similar to Simulation Example 1, simulation tests were prepared for hexagon shaped, square shaped, and circular shaped phosphorous-based LEDs designed for a primary red wavelength emission. Simulation tests were for LEDs having a maximum width of 10 μm, and mounted into a circular reflective well of 16 μm diameter at the bottom surface. Each LED was surrounded by a passivation material with a refractive index of 1.5. In an specific example, the reflective well structure is characterized by a 2.6 μm well height, 35 degree well angle, and 23.4 μm diameter top well opening. As shown in FIG. 6, similar to the results of Simulation Example 1, hexagon shaped LEDs mounted within circular reflective well structures in Simulation Example 2 provide higher LEE when compared to square and circular shaped LEDs. More specifically, LEE greater than 50% is achieved. In accordance with embodiments, LEE can be shown to be relatively stable for hexagon shaped LEDs mounted within circular reflective well structures with well angles (Wα) 30-60 degrees to horizontal. Additionally, LEE for the hexagon shaped LEDs remains higher than for other shaped LEDs at higher well angles (Wα), which may potentially have more suitable process capability, and minimize the footprint on the light emitting structure.

Figure 7:
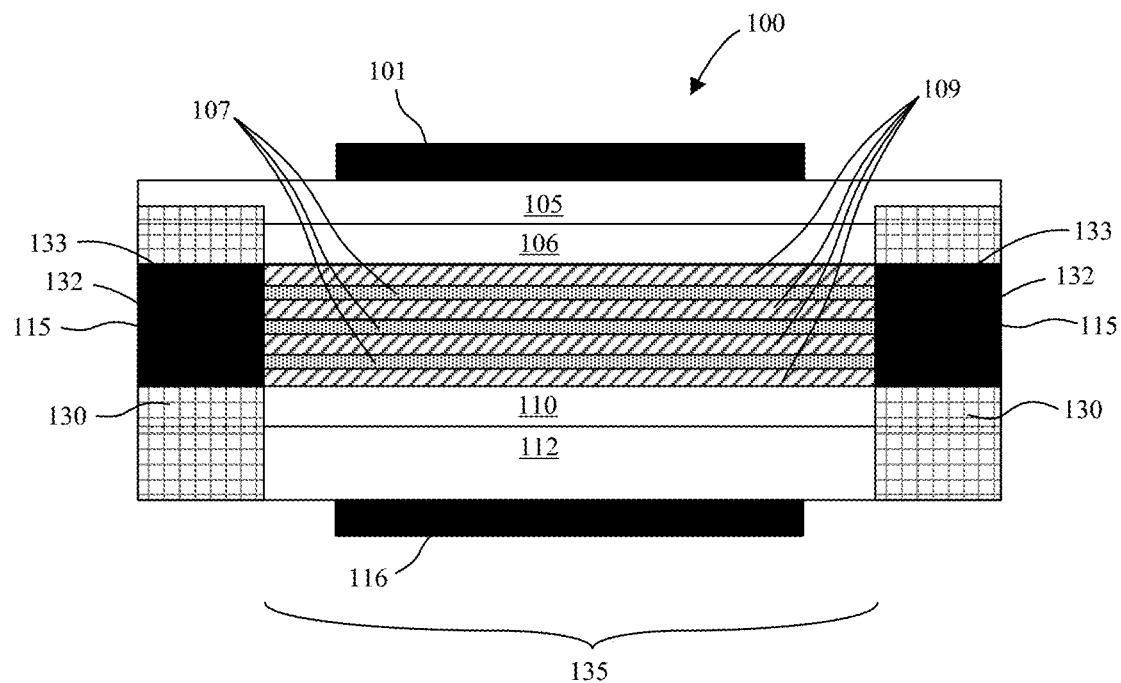
FIG. 7 is a schematic cross-sectional side view illustration of a phosphorous-based LED in accordance with an embodiment.

FIG. 7 is a schematic cross-sectional side view illustration of a phosphorous-based LED in accordance with an embodiment. The LEDs 100 can include a variety of configurations depending upon application. Accordingly, the specific structure illustrated in FIG. 7 is intended to be exemplary, and embodiments are not limited to the exemplary structure. Generally, LEDs 100 designed for emission of red light, may be formed from phosphorus-based materials. The following listing of materials for red emission is intended to be exemplary and not limiting. For example, the layers forming the LED 100 may include AlInP, InGaP, AlInGaP, AlGaAs, GaP, and GaAs. In an embodiment, top region 105 includes n-AlInP, n-InGaP, or n-AlGaInP, and bottom region 112 includes p-GaP, p-InGaP, p-AlInP, or p-AlInGaP. Active region 108 may be formed of a variety of materials, such as but not limited to, AlGaInP, AlGaAs, and InGaP.

In an embodiment, the active region (layer) 108 includes multiple quantum well layers 107 and quantum barrier layers 109. In an embodiment, the quantum barrier layers 109 are formed of the same material system as the cladding layers 106, 110. For example, the quantum barrier layers 109 may be formed of AlInGaP. The quantum barrier layers 109 may be modulation doped, for example, n-doped with a suitable n-type dopant such as Si.

In an embodiment, the LEDs 100 may be phosphorous-based inorganic semiconductor-based LEDs (e.g. GaP, AlGaInP, and their alloys) including hexagon shaped sidewalls 115. For example, the phosphorous-based LEDs 100 may be designed for emission of a primarily red wavelength of light. In such an embodiment, the LEDs 100 may have a cubic crystal structure. As a result, the formation of hexagon shaped LEDs 100 does not result in uniformly faceted sidewalls 115. It is believed that the non-faceted sidewalls 115 may create traps, and decrease reliability of the LEDs. Accordingly, in some embodiments, the LEDs 100 are designed to confinement current internally within the LEDs 100 and away from the non-faceted sidewalls 115.

Still referring to FIG. 7, in an embodiment the vertical inorganic semiconductor-based LED 100 includes a doped current confinement region 130 that spans along the hexagon shaped sidewalls 115 to confine current internally within a current injection region 135 of the LED 100 and away from the sidewalls 115. Doped current confinement regions 130 may be formed using techniques such as implantation, solid source diffusion, or vapor diffusion. In an embodiment, doped current confinement regions 130 are p-type, and include a dopant profile of a dopant such as Zn or Mg, or more specifically Zn. In an embodiment bottom region (layer) 112, and optionally cladding layer 110, are p-doped with a p-dopant such as Zn or Mg, or more specifically Mg during growth of the p-n diode layer. In-situ doping with Mg may be selected due to a corresponding low activation energy, and the ability to create free holes, while Zn may be selected for the formation of doped current confinement region 130 due to a greater ability to diffuse. In an embodiment, the doped current confinement region 130 extends through bottom region (layer) 112, cladding layer 110, active region 108, and into cladding layer 106. The doped current confinement region 130 may optionally extend partially into, or completely through, the top region (layer) 105.

As shown in FIG. 7, the doped current confinement region 130 may overalap the active layer region 108 to form intermixed regions 132. As shown the intermixed regions 132 are formed adjacent the active layer 108 such that the edges 133 of the active layer 108 are internally confined within the LED sidewalls 115. Specifically, the intermixed regions 132 are formed within the original quantum well layer(s) 107 and quantum barrier layers 109 forming the original active layer 108 where the diffusion profile of the dopant wells 130 overlap the active layer 108. In accordance with embodiments, the intermixed regions 132 may be characterized by a larger bandgap than the original quantum well layers 107 due to diffusion between the quantum well layers 107 and quantum barrier layers 109, and resultant alloy intermixing. Intermixing may result in the transformation of multiple quantum well layers 107 and quantum barrier layers 109 to form a singular intermixed region 132 with a larger bandgap than the original quantum well layers 107. More specifically, dopants (e.g. Zn, Mg) from the doped current confinement region 130 may facilitate diffusion from the original quantum barrier layer 109 into the quantum well layer 107 to form intermixed regions 132, and/or diffusion of In from the quantum well layers 107 into the quantum barrier layers 109 to form intermixed regions 132. Thus, the doped current confinement region 130 may facilitate alloy intermixing within the intermixed regions 132, which may raise the bandgap of the intermixed regions 132 relative to the quantum well layers 107 confined inside of the LED interior to the doped current confinement region 130.

In some embodiments, the LEDs 100 are micro LEDs, with a maximum width between sidewalls 153 of 1-300 µm, 1-100 µm, or more specifically 1-20 µm, such as 10 µm or 5 µm where the micro LED lateral dimensions may approach the carrier diffusion length. In some embodiments, the edges 133 of the intermixed region 132 encroach at least 200 nm within the LED sidewalls 115. Thus, the intermixed regions 132 may be at least 200 nm wide.

Simulation Example 3

Figure 8:
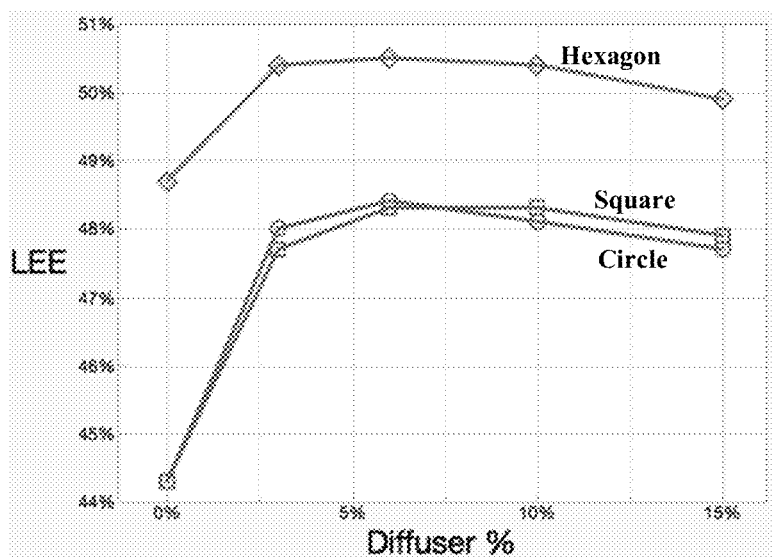
FIG. 8 is a graph illustrating simulation data of LEE for filler volume % within a diffuser layer surrounding phosphorous-based LEDs in accordance with embodiments.

As described above, the results of Simulation Examples 1-2 support the observation that LEE may be higher at certain well angles, such as 30-60 degrees to horizontal, also depending on other factors such as die sidewall angle and light source configurations (i.e. quantum well to contact layer thickness). Yet, higher well angles may potentially have higher process capability and scalable to higher pixel resolutions. FIG. 8 is a graph illustrating simulation data of LEE for filler volume % within a diffuser layer laterally surrounding phosphorous-based LEDs (e.g. red emitting) in accordance with embodiments. Specifically, the simulation data provided in FIG. 8 is with a fixed well angle of 45 degrees to horizontal, with diffuser layers laterally surrounding the LEDs within circular reflective well structures. The diffuser layer was formed of a host matrix material and scattering particles. The host matrix material may have a refractive index with value (1.8, for example) between that of the LED (2.4-2.5 for nitride and 3.3 for phosphide) and acrylic (1.5). The scattering particles need to have a refractive index delta different from host matrix material (delta>0.3 for example). One example of scattering material is $TiO_2$, which has a refractive index around 2.4, which makes the delta around 0.6. The scattering particles could also have refractive index (such 1.0-1.3) lower than 1.8 to provide the same delta. In accordance with embodiments, the size of scattering particle may be in the order of a fraction of wavelength to one wavelength, typically within 70-500 nm. While a primary purpose of the diffuser layer may be to improve angular distribution and make it closer to Lambertian as described with Simulation Example 5, where the scattering particles are not absorptive, the diffuser layer may provide a LEE boost, which may also potentially allow for integration of higher well angles.

Simulation Example 4

Figure 9:
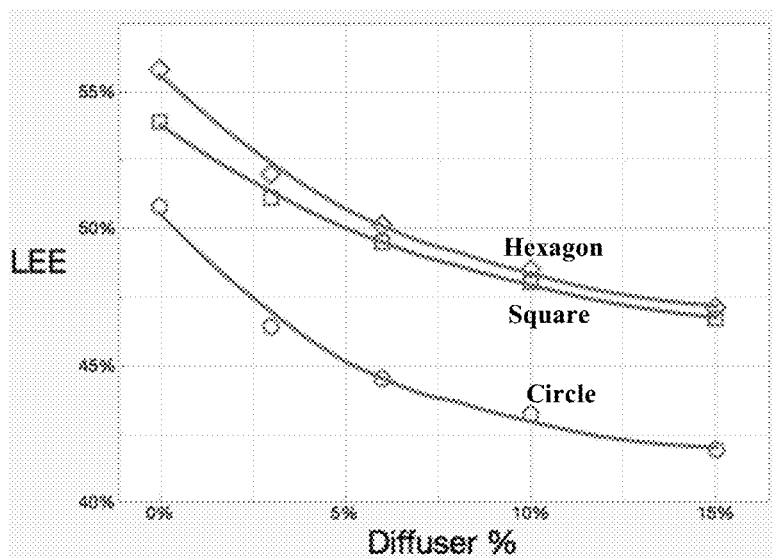
FIG. 9 is a graph illustrating simulation data of LEE for filler volume % within a diffuser layer surrounding nitride-based LEDs in accordance with embodiments.

Simulation tests were performed similarly as with Simulation Example 3, with instead test data performed for nitride-based LEDs (e.g. blue emitting), with fixed well angles of 32 degrees to horizontal. FIG. 9 is a graph illustrating simulation data of LEE for filler volume % within a diffuser layer surrounding nitride-based LEDs (e.g. blue emitting) in accordance with embodiments. Contrary to the results of Simulation Example 3, LEE was shown to decrease with diffuser volume % due to absorptive scattering particles. It is believed LEE could be higher with selection of non-absorptive particles/materials.

Viewing the results of Simulation Examples 1-4 together, it is observed that in all cases, hexagon shaped LEDs exhibit greater LEE when mounted within circular reflective well structures, when compared to circular and square shaped LEDs. Furthermore, it is shown that nitride-based LEDs (e.g. blue) exhibit slightly better LEE when compared to phosphorous-based LEDs (e.g. red). However, the addition of a diffuser layer laterally around the LEDs is found to increase LEE for phosphorous-based LEDs, even at filler volume % as high as 15%, while a diffuser layer is found to decrease LEE for nitride-based LEDs.

In some embodiments, the same diffuser layer may be formed within the respective reflecting well structures for LEDs designed for different color emission. In some circumstances, this may result in LEE of at least 50% for each LED. In an embodiment, the diffuser layer includes 1-7% by volume of scattering particles, or more specifically 4-5% in an embodiment. The diffuser layer may include scattering particles with an average particle size between 70-500 nm. Additionally, the scattering particles may have a different refractive index, n, (such as 2.1-2.4, or as low as 1.0-1.3), where the index contrast is greater than 0.3 (absolute value) from the host material (matrix material) with an index of refraction of 1.4-1.8. In some embodiments, the reflective well structures for corresponding LEDs of different color emission have different well angles to horizontal. In some embodiments, the reflective well structures all have the same well angle to horizontal. In an embodiment, the well angles are less than 45 degrees to horizontal.

Simulation Example 5

Figure 10:
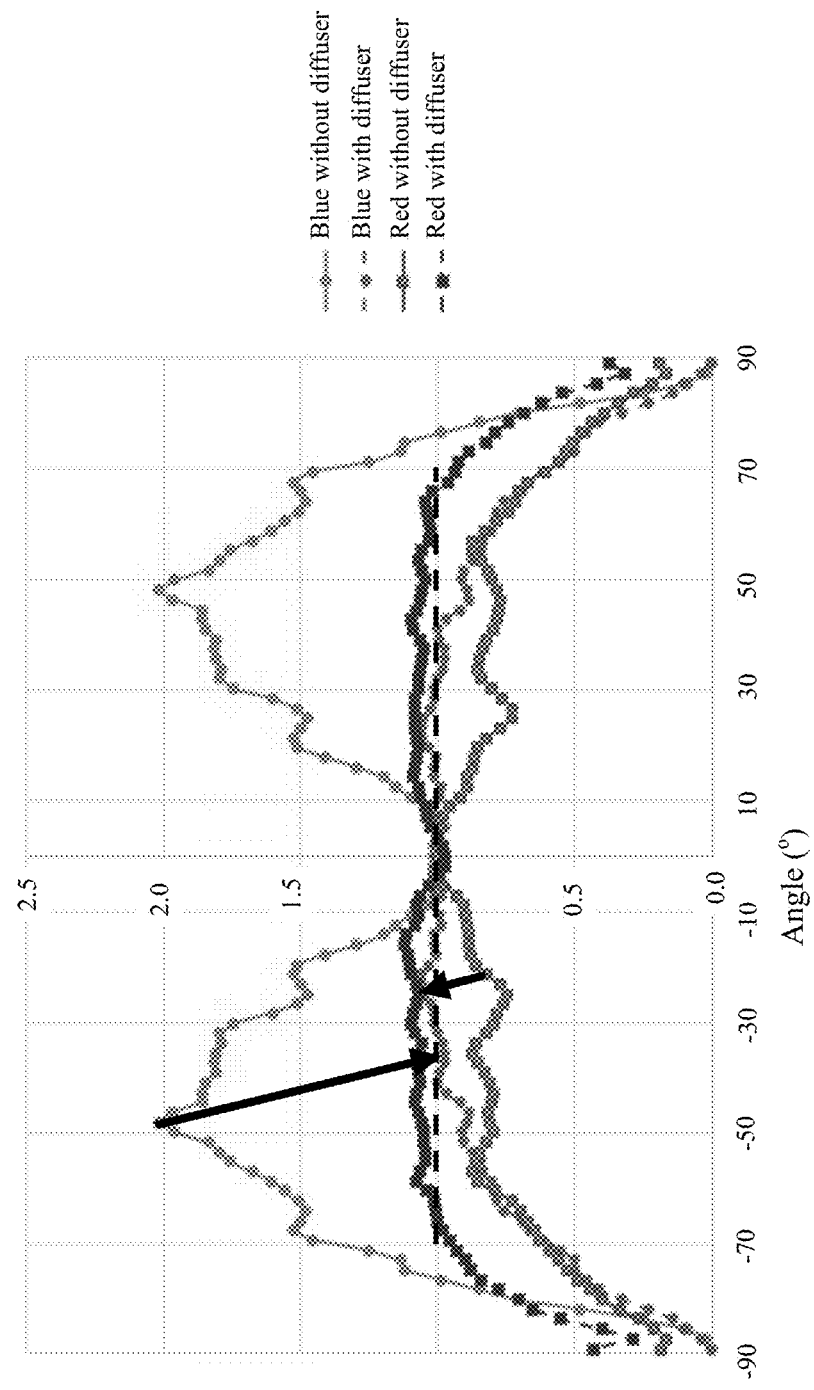
FIG. 10 is a graph illustrating simulation data of angular intensity and angular distribution for phosphorous-based LEDs and nitride-based LEDs with and without surrounding diffuser layers in accordance with embodiments.

While a diffuser layer has been observed to affect LEE, it has also been observed that a diffuser layer may additionally affect angular intensity and angular distribution from the LED. FIG. 10 is a graph illustrating simulation data of angular intensity and angular distribution for phosphorous-based LEDs (red LEDs) and nitride-based LEDs (blue LEDs) with and without surrounding diffuser layers in accordance with embodiments. Furthermore, each LED is a hexagon shaped LED mounted within a circular reflective well structure as previously described. Where a diffuser layer is not present, a transparent passivation layer is present. Additionally, in order to demonstrate the effectiveness of the diffuser layer on angular distribution and angular intensity, well angles are selected to be 45 degrees, a value in FIG. 4 and FIG. 6 in which LEE is trending down with increasing well angle.

With regard to FIG. 10, Lambertian distribution is qualitatively defined as a profile with intensity proportional to cos(angle). A cos corrected angular profile (intensity divided by cos(angle)) will be a flat line in the plot. The intensity is also normalized to its value at normal incidence (0 degrees) thus the relative intensity=1 at 0 degrees (as shown by the dashed black line). A perfect Lambertian profile will be a qualitatively flat profile at relative intensity=1. Sub-Lambertian is qualitatively defined with relative intensity >1, while Super-Lambertian is qualitatively defined with relative intensity <1. These definitions are applied to angles approximately <70 degrees as intensity at higher angles has larger solid angle but needs to be divided by cos(angle closer to 90 degrees) which is close to zero.

Referring to the results in FIG. 10, the circle data points (blue LEDs) without a diffuser layer are clearly Sub-Lambertian, while the square data points (red LEDs) without a diffuser layer are Super-Lambertian. As shown by the bold arrows, with the addition of a diffuser layer, the angular profiles for both the red LEDs and the blue LEDs become closer to Lambertian.

Figure 11:
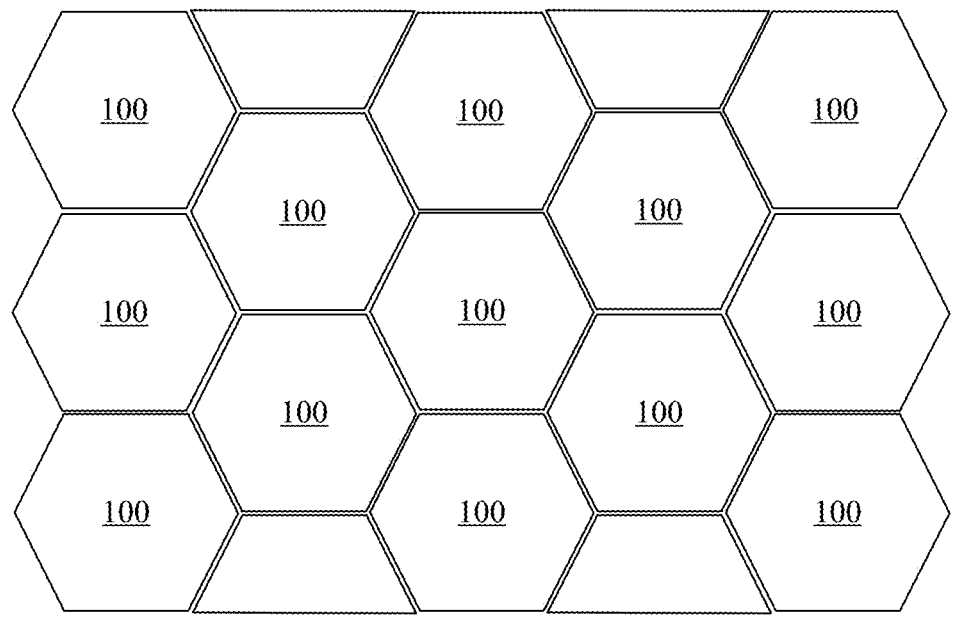
FIG. 11 is a schematic top view illustration of an array of hexagon shaped LEDs on a donor substrate in accordance with an embodiment.
Figure 12:
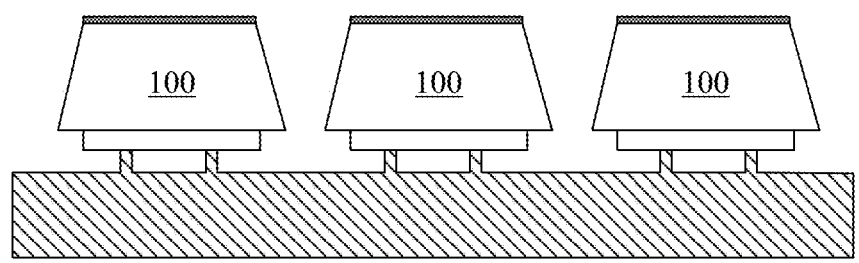
FIG. 12 is a schematic cross-section side view illustration of an array of hexagon shaped LEDs on a donor substrate in accordance with an embodiment.

In accordance with embodiments, the LEDs 100 used to form the light emitting structures 300 may be first fabricated on a donor substrate where they are poised for pick-up and transfer to the substrate 302 of the light emitting structure 300, for example, using a micro device electrostatic transfer head array assembly. FIGS. 11-12 are schematic top view and cross-sectional side view illustrations of an array of hexagon shaped LEDs on a donor substrate in accordance with an embodiment. As shown in FIG. 11, for a given LED 100 size required to satisfy processing mask tolerances the area for hexagon shaped LEDs 100 is approximately 13.4% less than for square LEDs 100 arranged side-by-side. In accordance with embodiments, this enables more LEDs to be fabricated per donor substrate, and processing cost savings due to more efficient use of epitaxial LED material.

Referring briefly back to FIG. 7, assuming the same current injection region 135 size (e.g. an internal circular region), a hexagon shaped LED 100 has approximately 13.4% shorter perimeter and a 13.4% less LED area than compared to a square shaped LED 100, which may enable reduction of parasitic non-radiative recombination and higher IQE.

Referring now to FIG. 12, in an embodiment, a donor substrate 500 includes an optional base substrate 502 (e.g. silicon, sapphire, glass, etc.) and a stabilization layer 504 which includes a plurality of stabilization posts 506. The stabilization layer 504 and stabilization posts 506 may be formed of a variety of materials. Each LED 100 may be supported by one or more (e.g. a plurality) of stabilization posts 506, which may be in direct contact with a single or multiple bottom conductive contacts 114 for each corresponding LED 100. In this manner, the total contact area between the stabilization posts 506 and bottom conductive contact(s) 114 may determine the adhesion forces retaining the LEDs 100 on the donor substrate 500, as well as the adhesion forces to be overcome during LED transfer from the donor substrate to the light emitting structure 300 substrate 302.

In utilizing the various aspects of the embodiments, it would become apparent to one skilled in the art that combinations or variations of the above embodiments are possible for integrating light emitting devices including hexagon shaped LEDs. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:
1. A light emitting structure comprising:
a first circular reflective well structure;
a first vertical inorganic semiconductor-based light emitting diode (LED) including first hexagon shaped sidewalls mounted within the first reflective well structure;
a second circular reflective well structure:
a second vertical inorganic semiconductor-based light emitting diode (LED) including second sidewalls mounted within the second reflective well structure;
wherein the first circular reflective well structure and the second circular reflective well structure have different well angles to horizontal: and
a diffuser layer within the first circular reflective well structure and the second circular reflective well structure, wherein the diffuser layer laterally surrounds the first hexagon shaped sidewalls and the second side- walls, and the diffuser layer comprises scattering particles dispersed in a matrix material.

2. The light emitting structure of claim 1, wherein the first circular reflective well structure is characterized by a reflectance of greater than 50% for a primary emission wavelength of the vertical inorganic semiconductor-based LED.

3. The light emitting structure of claim 2, wherein the first circular reflective well structure is taller than the first vertical inorganic semiconductor-based LED, such that a top surface of the first vertical inorganic semiconductor-based LED is below a top surface of the first circular reflective well structure.

4. The light emitting structure of claim 1, wherein the first vertical inorganic semiconductor-based LED has a hexagonal crystal structure, and the first hexagonal shaped sidewalls are faceted sidewalls.

5. The light emitting structure of claim 1, wherein the first vertical inorganic semiconductor-based LED has a cubic crystal structure, and the first hexagonal shaped sidewalls are not faceted sidewalls.

6. The light emitting structure of claim 5, wherein the first vertical inorganic semiconductor-based LED includes a doped current confinement region along the first hexagonal shaped sidewalls to confine current internally within the first vertical inorganic semiconductor-based LED.

7. The light emitting structure of claim 1, wherein the diffuser layer comprises 1-7% by volume of the scattering particles.

8. The light emitting structure of claim 7, wherein the scattering particles are formed of a material characterized by a refractive index contrast of greater than 0.3 to the matrix material of the diffuser layer.

9. The light emitting structure of claim 8, wherein the first circular reflective well structure includes a circular sidewall with a well angle of 30 to 60 degrees to horizontal.

10. The light emitting structure of claim 1, wherein the second sidewalls are second hexagon shaped sidewalls.

11. The light emitting structure of claim 1, further comprising a transparent conductor layer spanning over the diffuser layer within:
the first circular reflective well structure and on and in electrical contact with a top contact of the first vertical inorganic semiconductor-based LED; and
the second circular reflective well structure and on and in electrical contact with a top contact of the second vertical inorganic semiconductor-based LED.

12. The light emitting structure of claim 11, wherein the first vertical inorganic semiconductor-based LED has a hexagonal crystal structure, and the first hexagonal shaped sidewalls are faceted sidewalls.

13. The light emitting structure of claim 12, wherein the second vertical inorganic semiconductor-based LED has a cubic crystal structure, and the second hexagonal shaped sidewalls are not faceted sidewalls.

14. The light emitting structure of claim 13, wherein the diffuser layer comprises 1-7% by volume of the scattering particles.

15. The light emitting structure of claim 14, wherein the scattering particles are formed of a material characterized by a refractive index contrast of greater than 0.3 to the matrix material of the diffuser layer.

16. The light emitting structure of claim 14, wherein the first circular reflective well structure and the second circular reflective well structure each include a circular sidewall with a respective well angle of 30 to 60 degrees to horizontal.

17. The light emitting structure of claim 10, wherein each of the first and second circular reflective well structures has a bottom diameter of 16 μm or larger and a top diameter of 25 μm or less.

* * * * *